United States Patent [19]
Donath

[11] Patent Number: 6,087,826
[45] Date of Patent: Jul. 11, 2000

[54] DEVICE FOR DETECTING ELECTROMAGNETIC STRAY EFFECTS IN SYSTEMS WITH AT LEAST TWO INDUCTIVE SENSORS PROVIDING PERIODIC OUTPUT SIGNAL

[75] Inventor: Ralf Donath, Ditzingen, Germany

[73] Assignee: Robert Bosch GmbH, Stuttgart, Germany

[21] Appl. No.: 08/952,300

[22] PCT Filed: Apr. 12, 1997

[86] PCT No.: PCT/DE97/00746

§ 371 Date: Feb. 8, 1998

§ 102(e) Date: Feb. 8, 1998

[87] PCT Pub. No.: WO97/39929

PCT Pub. Date: Oct. 30, 1997

[30] Foreign Application Priority Data

Apr. 18, 1996 [DE] Germany ............................ 196 15 203

[51] Int. Cl.⁷ ................................. B60T 8/32; G01P 3/48; G01P 3/56; G01R 29/00
[52] U.S. Cl. ........................... 324/161; 324/166; 324/173; 324/207.12; 324/207.15; 324/613; 303/138; 702/96; 702/148
[58] Field of Search ..................................... 324/160, 161, 324/163, 166, 173, 174, 207.12, 207.15, 207.16, 225, 613; 702/96, 104, 190, 191, 142, 145–148; 188/181 R; 303/138; 340/670–672; 361/240; 123/406.59–406.63, 617; 73/514.39

[56] References Cited

U.S. PATENT DOCUMENTS 4,808,920 2/1989 Brauninger et al. ..................... 324/161

FOREIGN PATENT DOCUMENTS

P19503271 1/1995 Germany .

Primary Examiner—Gerard Strecker
Attorney, Agent, or Firm—Michael J. Striker

[57] ABSTRACT

A device for detecting electromagnetic stray effects in systems with at least two inductive sensors which provide an essentially periodic output signal, performs a signal evaluation for evaluating signals of the sensors, a test for detecting an electromagnetic stray effect, whether periods of the signals to be evaluated lie within a period length of expected stray effects, a test, if applicable, whether detected signal progressions have at least a progression typical for stray pick-up, plausibility tests by means of at least one further detected signal in which a signal to be checked is compared with parallel measured other signals, and detecting a stray effect only if all tested conditions provide a result which is typical for stray effects.

11 Claims, 4 Drawing Sheets

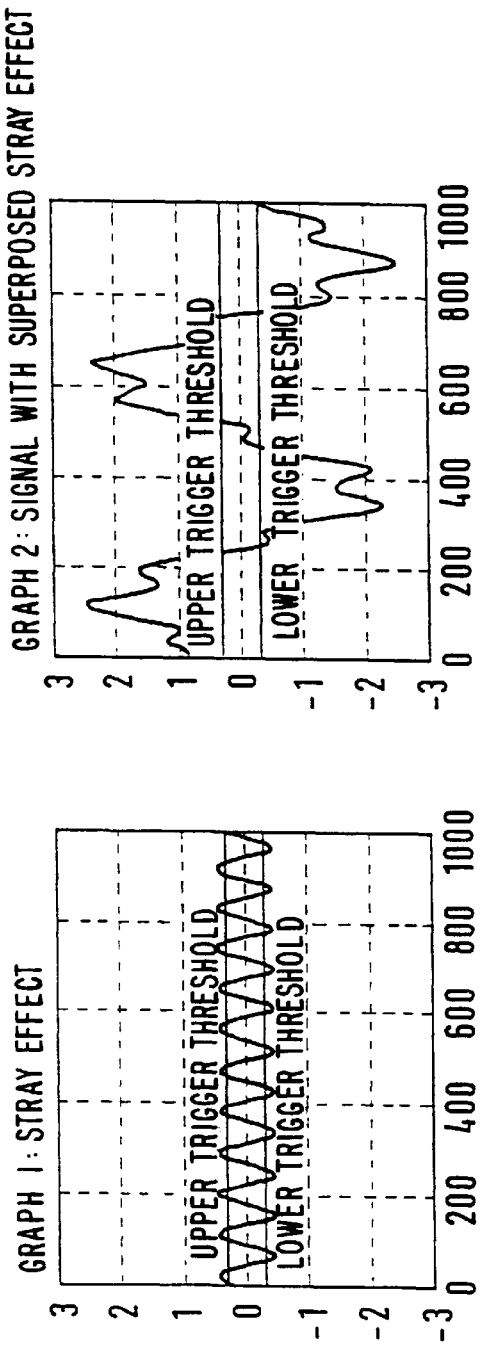
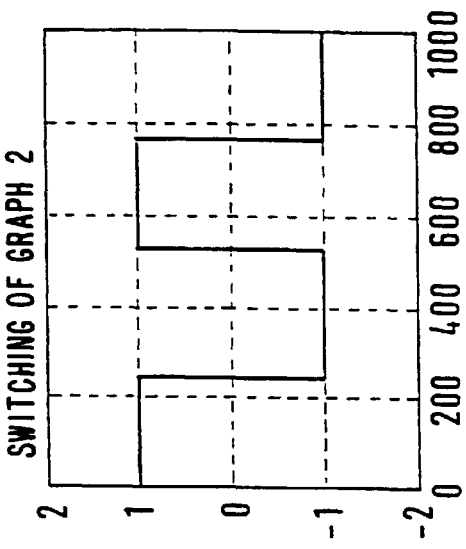
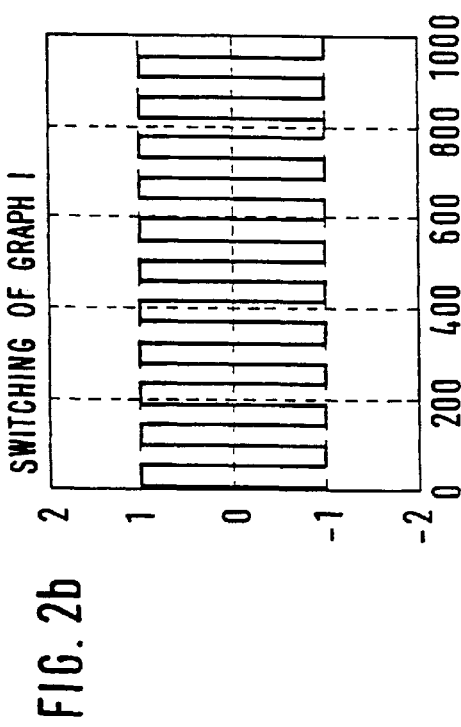
FIG. 2a
FIG. 2b

DEVICE FOR DETECTING ELECTROMAGNETIC STRAY EFFECTS IN SYSTEMS WITH AT LEAST TWO INDUCTIVE SENSORS PROVIDING PERIODIC OUTPUT SIGNAL

BACKGROUND OF THE INVENTION

The present invention relates to a device for detecting electromagnetic stray effects.

Four rpm sensors, which are assigned to the respective wheels, are customarily employed in connection with vehicles equipped with an anti-lock system (ABS) or a traction control system (ASR), (ABSR), or a dynamic drive control (FDR). Customarily the rpm sensors are inductive pick-ups, whose output signal shows a sinusoidal progression. Following processing, a triangular-shaped pulse sequence is obtained, the rpm of the respective wheel can be determined from the chronological distance of the individual pulses or individual pulse flanks.

The information derived from the rpm sensors is supplied to a control unit, for example an ABS control unit, which performs the required control steps on the basis of the detected wheel rpm. Since erroneous output signals of the rpm sensors negatively affect the control, it should be assured that the signals supplied ru by the rpm sensors are actually based on the rpm of the wheel and not on possible stray signals. Inductive rpm sensors react particularly sensitively to exterior influences, for example field changes caused by public electrical power nets which are known to have frequencies of 50 or 60 Hz. It is possible to generate signals by means of such electrical power nets in the rpm sensors, which do not correspond to the control value to be detected, i.e. not to the rpm to be detected. Such signals are called stray effects.

Electromagnetic stray effects not only occur with rpm sensors, but also with inductive sensors in general, for example with sensors for distance measuring, angular changes, for example in engine control, etc. When used in vehicles in particular, steps should be taken to detect the stray effects and make it impossible for signals, which are generated by inductive stray effects, to be erroneously used as useful signals.

An anti-lock system, wherein a detection of stray effects caused by electromagnetic fields of the electrical power nets on inductive receivers is performed, and wherein the anti-lock system itself takes steps which assure that no undesired control conditions occur because of the stray effects, is known from patent application DE-P 1 95 032 71.3. In this known anti-lock system, the vehicle reference velocity required for control is determined from output signals of wheel rpm sensors. As soon as it is noted that the frequency of the signal to be evaluated lies within a critical range of approximately 50 to 60 Hz, additional steps are taken which prevent that stray effects result in errors in the calculation of the reference velocity.

The signals generated by electromagnetic stray effects from electrical power nets disadvantageously arise in particular if no signal at all should be generated by the rpm sensor, i.e. when the vehicle is stationary or moves in a speed range below 2.75 km/h. The stray effect signals at frequencies of 50 or 60 Hz cause some problems in particular in connection with presently used braking control units at speeds of approximately 5 to 15 km/h. Which speed is particularly critical is a function of various parameters, for example the wheel circumference, the number of teeth of the disk scanned by the sensor, etc. The amplitude of the electromagnetic stray effects customarily lies below 150 mV. At frequencies of 50 to 60 Hz, the signals from the rpm sensors should lie in the Volt range. Based on these facts, known per se, the object of the invention is to dependably detect electromagnetic stray effects in the range of 50 to 60 Hz, which for example are caused by the public electric power nets, and to assuredly suppress the associated information before it is supplied to a downstream located control device, or to compensate them. This object is attained by a device for the detection of electromagnetic stray effects.

SUMMARY OF THE INVENTION

The device in accordance with the invention for detecting electromagnetic stray effects has the advantage that the stray effects can be distinguished from the useful signals in a particularly dependable manner. With this it is simultaneously assured that no erroneous information is processed in a downstream located processing device, for example a downstream located ABS, ABSR or FDR control unit. This advantage is achieved in that three independent tests take place. During the first test the period length of the signals provided by the sensors is measured as the basic prerequisite for detecting stray effects. If this period length lies within a range which matches the period length of the expected stray effect, inclusive of a certain tolerance, it can be seen that there is the possibility, that the registered signal is a stray effect. However, since it can also be a real signal, further tests follow this first test. In this case an evaluation is performed in the second test, whether the registered signal progressions are signal progressions which are expected in connection with stray signal effects. This test is based on the realization, that at low vehicle speeds or at a vehicle speed equal to 0, i.e. under conditions where the frequency of the output signals is minimal, sensor signals change in a characteristic way if stray effects appear. If such a characteristic signal progression is detected, there is already a high probability that the registered signal is a stray effect. However, in order to make completely sure that this is a stray effect, a plausibility test is performed in the third test, in which the signal to be checked is compared with parallel measured other signals, for example from one or several other rpm sensors. Only when this third test also discloses that the signal to be tested is not a regular signal, is it assumed that this is a stray effect, and the respective signal is excluded from further processing. Afterwards recourse is made to a replacement signal, for example, or the stray signal is corrected in a plausible direction.

It has been shown to be particularly advantageous to perform the detection of stray effects, as well as the subsequent steps for preventing the erroneous use of the signal generated by the stray effect, in a separate processing device, for example a separate microprocessor, or as an upstream located module of the control processor. This has the advantage over the known solution, in accordance with which the stray effect steps are only performed in the control unit itself, that arbitrary control units can be employed, to which sensor output signals, which have already been checked for dependability, are supplied.

Further advantages of the invention are to be seen in that the stray effect detection can be used independently of the type of vehicle propulsion, i.e. independently whether a rear wheel, front wheel or all wheel drive of the vehicle has been provided. The number of teeth of the sensor wheel is not important, i.e. it is not necessary to select a number of teeth which do not deliver critical signal frequencies. In an advantageous manner it is possible to realize the velocity processing, including the required steps for detecting the stray effects and the suppression of erroneous signals, as a software solution.

BRIEF DESCRIPTION OF THE DRAWINGS

An exemplary embodiment of the invention is represented in the drawings and will be explained in more detail in the following description. In detail, FIG. 1 shows a block wiring diagram of a device in accordance with the invention for detecting electromagnetic stray effects. Output signals as well as processed signals of rpm sensors have been plotted over time in FIGS. 2a and 2b, wherein a signal progression is shown in the graphic representation 1 which occurs in connection with a stray effect without a useful signal. The signal progression when a useful signal as well as a superimposed stray effect are present, is shown in graphic representation 2. The running checking process is represented in FIG. 3 as a flow chart, and characteristic signal progressions in connection with stray effects are represented in FIGS. 4a and 4b, wherein

DESCRIPTION OF THE PREFERRED EMBODIMENTS

Figure 1:
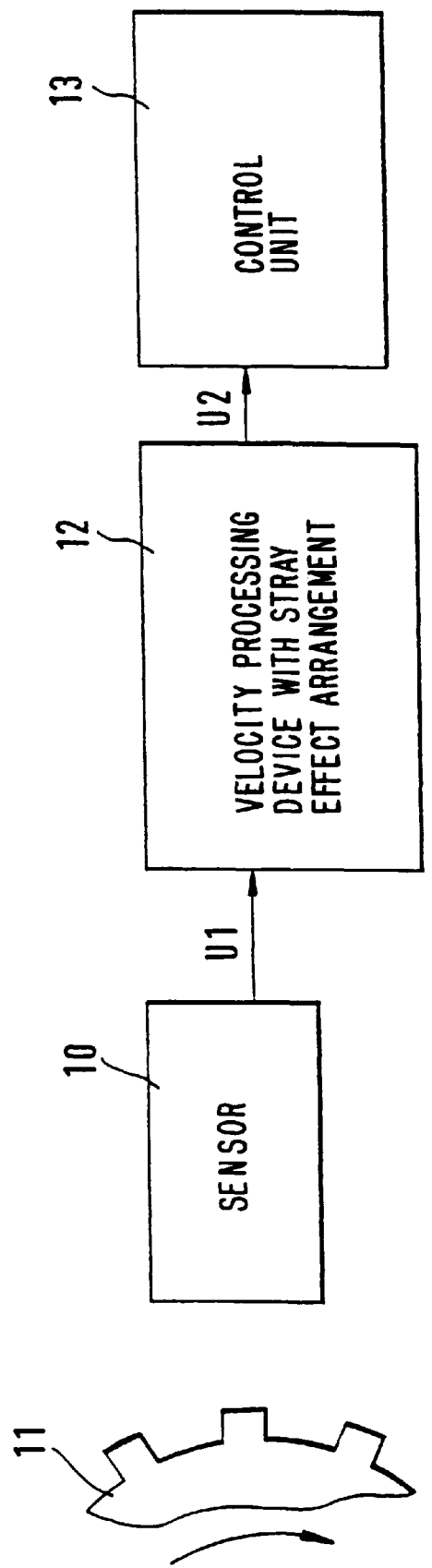

An exemplary embodiment of a device in which the stray effect detection in accordance with the invention can take place is represented in FIG. 1. In this example a gear wheel 11, which is connected with the shaft of a wheel, for example, and rotates synchronously with this wheel, is scanned by means of a sensor, for example an rpm sensor. The output signal of the sensor 10 is, identified by U1 and is supplied to a velocity processing device with a stray effect arrangement 12, which is designed, for example, as a microprocessor. The output signal of the velocity processing device with a stray effect arrangement 12 is designated as U2 nd is supplied to the control unit 13 which, for example, can be an ABS, ABSR or FDR control unit. Since the signal U2 is already corrected, i.e. no longer has any contents caused by stray effects, no further measures for suppressing or disregarding stray-effect components need to be taken in the control unit 13.

Only a single sensor 10 is indicated in the example represented in FIG. 1. Several sensors 10 and gear wheels 11 are provided with customary anti-lock systems or traction control systems or dynamic drive controls, customarily such a sensor 10 and gear wheel 11 are provided at each wheel of a vehicle. However, the device represented in FIG. 1 is not limited to the control systems mentioned, but can be extended to any arbitrary sensor system in which stray effects by electromagnetic fields can occur, particularly at 50 or 60 Hz.

In the exemplary embodiment of FIG. 1 the signal U1 shows a periodic progression, wherein the period is a function of the velocity of the gear wheel 11 and the number of teeth of the gear wheel. Without stray effect, the signal U1 usually is a quite uniform signal. Prior to further processing, this signal is converted into a rectangular signal, wherein customarily it is compared with trigger thresholds in a comparator, and conversions are made respectively at an upper trigger threshold and at a lower trigger threshold.

The output signals U1 of a sensor 10 have been plotted over time in FIG. 2a, wherein the signals which are identified as graphic representation 1 are exclusively signals which were generated by electromagnetic stray effects caused by magnetic fields of an electrical power net. A regular rpm sensor signal, on which stray effect signals are superimposed, is present in the signals represented in graphic representation 2.

When the upper trigger threshold is exceeded or the lower trigger threshold is downwardly exceeded, a comparator, which is a component of the velocity processing device with a stray effect arrangement 12, is switched on and the rectangular progression represented in FIG. 2b is created.

If there is a stray effect without a real signal, the comparator is switched on at the trigger thresholds, wherein switching is caused by the stray effect. With customary rpm sensors the voltage amplitude is in the millivolt range when there is only a stray effect. But when the vehicle starts off, a signal is generated in the sensor 10 by the rotating gear wheel 11, whose amplitude at a velocity which corresponds to a frequency of 50 or respectively 60 Hz is considerably greater and lies in the Volt range. The stray effect superimposed on this signal has practically no effect on the switching of the comparator, from which it can be concluded that the stray effect only acts interferingly when the vehicle is standing still or at a very low velocity. At these velocities the frequency of the signal of the sensor lies below fmin. In this velocity range the sensor does not yet provide an assuredly usable signal. With current ABS, ABSR and FDR systems this range lies at a vehicle velocity of approximately 2.5 km/h. As will be explained in detail later on, the mentioned conclusion can be used as a probability test.

The period length of the processed signal is evaluated to determine the wheel velocity. If interference signals have already been dependably detected and screened out at this time, it is assured that the detected velocity is the actual velocity.

Figure 3:
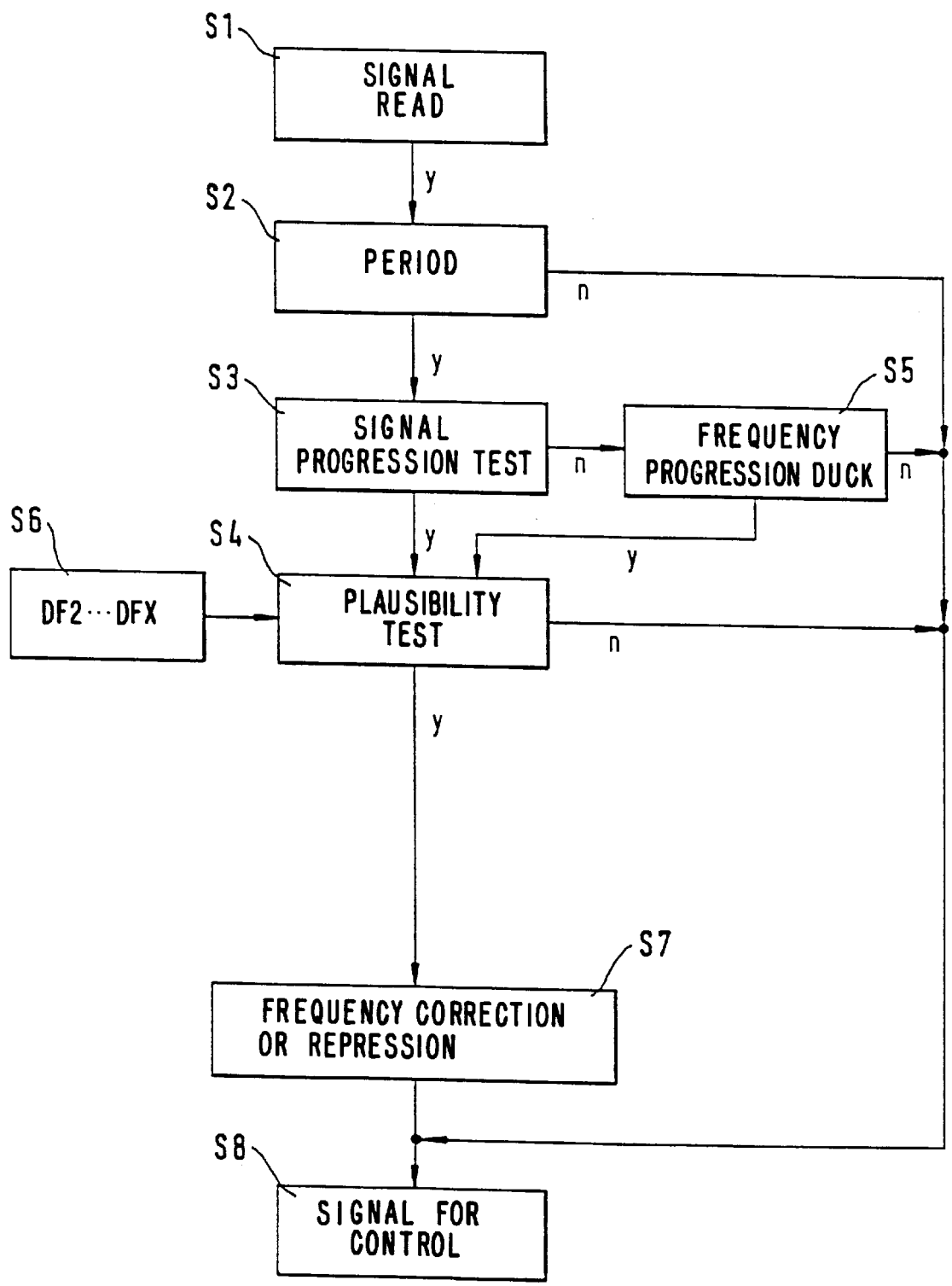

When testing to determine whether the registered signal are real signals or whether these are stray effects, the actions described in more detail below are performed. The individual steps in this connection are explained in more detail by means of the flow chart represented in FIG. 3. A system has been selected as an exemplary embodiment, wherein an inductive sensor is assigned to each wheel of a motor vehicle, or at least to both front wheels and to the differential of the rear axle (three sensor vehicle), each of which scans a rotating gear wheel and emits a periodic output signal which is a function of the wheel velocity. The stray effect detection itself is here performed with the aid of a microprocessor or a module, which in an advantageous manner is not a component of a downstream connected control unit. All three or four rpm sensors are checked for stray effects.

A test is performed in the mentioned microprocessor whether the basic prerequisite for the appearance of problematic stray effects has been met. To this end the period length of the sensor signals is measured. If this period length matches the period length of the expected stray effects plus minus a predeterminable tolerance, there is the change of a stray effect. However, since this could also be a real signal, further tests follow the first test, which can be considered to be an expanded signal evaluation. As can be seen from FIG. 3, for testing the basic prerequisite, the signals of a wheel rpm sensor are read in in a first step S1. The period of these signals is determined in step S2. If the determined period length does not match the period length of the expected stray effect including the tolerance to be expected, the signal is determined to be correct and is supplied as the input or actual value (S8) to a downstream connected control unit, for example an ABS control unit, and the stray effect detection in respect to the respective signal is terminated. But if it is determined in step S2 that the period length matches the period length of the expected stray effect plus minus the tolerance, a second test is performed in step S3. In the course of this second test a check is made whether the respective signals show a signal progression characteristic for stray effects. These actions are based on the recognition that in the absence of useful signals, i.e. wheel velocities below a minimal value, stray effect signals show characteristic progressions. These characteristic signal progressions will be explained in more detail in what follows by means of FIGS. 4a and 4b. In this case not the velocities, but the associated frequencies have been plotted in FIGS. 4a and 4b, however, velocities could also be plotted.

Figure 4A:
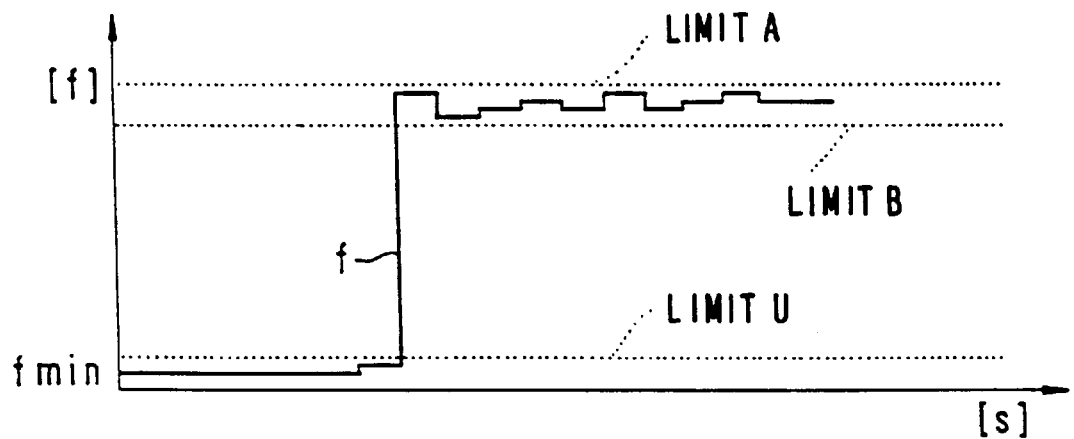
FIG. 4a represents an example for a jump in the frequency, and FIG. 4b a slow, step-by-step growth of the frequency as a result of stray effects.

A first possible characteristic signal progression is represented in FIG. 4a. The frequency of the signal is here plotted over time. Initially, the frequency of the signal is fmin, this corresponds to the minimal usable frequency of the sensor. When the stray effects appear, the frequency f jumps to a value which lies inside a so-called detection band A/B, with an initially large fluctuation width. This signal progression was detected by means of a plurality of measurements. Such a signal progression is quite improbable for real frequency progressions, i.e. for frequency progressions generated by actual useful signals.

Figure 4B:
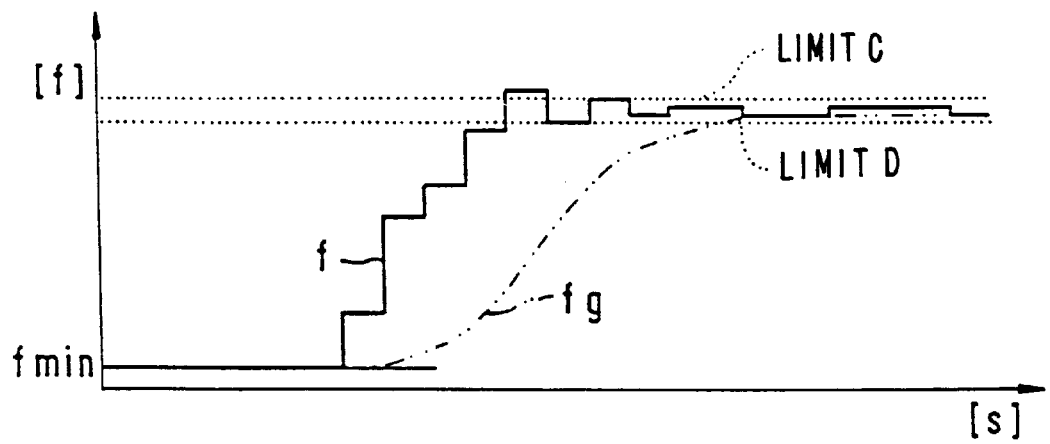

A frequency progression for stray effects has been plotted in FIG. 4b, which corresponds to a progression often occurring in actuality. This progression corresponds to an increasing wheel velocity, the frequency initially lies in a range near the minimum usable frequency of the sensor (fmin). Then the frequency f increases and lies within a defined fluctuation width. This fluctuation width is delimited by a detection band C/D. If the frequency change is actually caused by a stray effect which, for example, is a constant 50 Hz, the fluctuation width of the signal generated by the stray effect will be very narrow after a certain time. This is taken into consideration during the further evaluation of this signal progression.

The two frequency progressions represented in FIGS. 4a and 4b are evaluated for stray effect detection as characteristic signal progressions during stray effects, i.e. a check is made whether the actual rpm signal shows one of these characteristic progressions. The detection of a jump, identified as step S3 in the method of FIG. 3, takes place in such a way that, when the frequency of the signal jumps from a value which lies below the limit U, i.e. near fmin, directly into the range within the limits A and B, this is detected as a jump. The determination of the limits A and B takes place in such a way that the stray effect frequencies to be expected assuredly lie within the range A/B. Since the frequency progression represented in FIG. 4a is rather improbable, the limits A and B can be selected in such a way that the detection band A/B is relatively wide.

If it is determined that a frequency jump as represented in FIG. 4a has occurred, it is assumed that there is a high probability that this is a stray effect. In the method represented in FIG. 3, the next step S4 is initiated, in which a third test is performed. However, if in step S3 no characteristic jump of the frequency in accordance with FIG. 4a is detected, a check is made in step S5 whether the signal to be evaluated has a frequency progression such as represented in FIG. 4b. This so-called long-time detection in step S5 is performed based on the following considerations: if a stray effect occurs, the fluctuation width is very narrow after a certain time, therefore the frequency band C/D can be selected to be very narrow, the probability of a wrong detection in case of a stray effect is reduced by this. Since the signal has settled only after a certain time, monitoring can only be activated thereafter. To this end an additional frequency fg, which is filtered by a so-called PT1-member, is derived from the frequency signal of the rpm sensor. Only when f and fg are inside the limits C/D, can a stray effect be detected by means of the long-time detection. In the course of the long-time detection it is additionally assumed that at least one other frequency signal is free of stray pick-ups, i.e. is located close to the line fmin, or that a stray pick-up had already been detected in another one. Furthermore, both frequencies f and fg should have a tendency to move upward or remain level, since a falling frequency is not characteristic of a stray effect.

If it is detected in step S5 that the above described longtime detection of the frequency change has occurred, the step S4 is also activated and the third test takes place. If, however, in step S5 no long-time detection is recognized, the signal is considered to be correct and is supplied to the downstream connected control unit (S8). The stray effect detection is terminated for this cycle.

In the third test following step 4, a plausibility test is performed, which also takes parallel measured other signals into consideration. These other signals are signals, for example, from other wheel rpm sensors (DF2, DFX) with X=3 or 4 with ABS, or a signal which is available already in connection with ABS, ABSR or FDR. If the plausibility test shows after step S4, for example the comparison of the four DF signals, that the stray effect suspected by means of long-time detection or jump detection is not a stray effect after all, the respective signal is passed on as a useful signal to the control unit. In this case it can be assumed that, if a signal would detect stray effects by means of long-time detection or jump detection and one of the other signals is neither within the limits nor below the usable signal range, there is a considerable certainty that no stray effect has occurred. It follows from this that:

All four sensors must be within the limits or below the usable signal range if there is a stray effect.

If it is concluded that there is a stray effect, and the checked signal has been definitely recognized in step S4 as a signal caused by stray effect, a suppression or correction of the signal takes place after S7. But if it is determined in step S4 that this is a plausible signal, the signal is recognized as being correct and is supplied to a downstream connected control unit, for instance an ABS control unit, as the input value or actual value. If a stray effect is recognized, the signal is processed after S7 as already mentioned. In this case the frequency f is conformed with a suitable rise (0–∞) to the frequency fmin or, in case of a jump, the signal is suppressed. This corrected signal is then passed on to the control unit.

As soon as the signal to be evaluated is inside the usable signal range and not within a third limit band which must be larger than a/b or c/d (hysteresis), it is assumed that a real signal is present, and the stray effect detection is reset.

What is claimed is:

1. A device for detecting electromagnetic stray effects in systems with at least two inductive sensors which provide an essentially periodic output signal, the device comprising signal evaluation means for evaluating signals of the sensors; means responsive to the evaluated signals for making a test for detecting the expected existence of an electromagnetic stray effect by determining, whether periods of the evaluated signals lie within a period length of expected stray effects; means for making a test in the case when the periods of the evaluated signal lie within a period of expected stray effects, by determining whether detected signal progressions of said evaluated signal have at least a progression typical for stray pick-up; means for conducting plausibility tests of said evaluated signals having a progression typical for stray pickup by comparing the evaluated signals. with parallel measured other signals obtained within the systems; and means responsive to said comparison for detecting that a stray effect exists only if all tested conditions provide a result which is typical for stray effects.

2. A device as defined in claim 1, wherein said, signal evaluation means include a means selected from the group consisting of a microprocessor and an upstream connected module in a microprocessor of a control unit, which performs required testing processes.

3. A device as defined in claim 1; and further comprising means for suppressing or correcting a respective signal if a stray effect has been detected so as to form a replacement signal which is made available for further processing.

4. A device as defined in claim 3; and further comprising a control unit in which the further processing is employed, said control unit being a control unit of a system selected from the group consisting of an antilock system, a traction control system, a combined anti-lock/traction control system, a dynamic drive control, and an engine control.

5. A device as defined in claim 1, wherein said means for making a test for detecting the electromagnetic stray effect is operative for testing output signals of at least two inductive sensors and producing results, said means for testing plausibility checking the results for plausibility.

6. A device as defined in claim 1, wherein said means for making a test of detected signal progressions is operative for investigation of a frequency change of the signal over time.

7. A device as defined in claim 1, wherein said means for making a test of detected signal progression is operative so that at least two frequency progressions which are characteristic for stray effects are tested, wherein a first frequency progression is a jump of a frequency from a minimal frequency into a predeterminable frequency band with limits A and B, and a second frequency progression is a slow, step-by-step rise of a frequency from a minimal frequency into a frequency band with limits C and D.

8. A device as defined in claim 7, wherein the limits A, B, C, and D are determined by means of empirical measurements.

9. A device as defined in claim 8, wherein a frequency band between the limits A and B is greater than a frequency band between the limits C and D.

10. A device as defined in claim 7; and further comprising means for filtering a frequency progression and step-by-step entering into the band C/D only when a filter frequency reaches a respective frequency band.

11. A device as defined in claim 1; and further comprising means for resetting a stray effect by using a frequency band whose limits contain limits A, B, C, and D so that hystresis develops in order to prevent "nervous" detection and setback.

* * * * *